United States Patent
Subrahmanyam et al.

(10) Patent No.: US 7,206,661 B2
(45) Date of Patent: Apr. 17, 2007

(54) PERSISTENT NAMING FOR SUB-PATHS OF INTERMITTENT FILLET WELD BEADS

(75) Inventors: Somashekar Ramachandran Subrahmanyam, Farmington Hills, MI (US); Shivakumar Sundaram, Canton, MI (US)

(73) Assignee: Autodesk, Inc., San Rafael, CA (US)

( * ) Notice: Subject to any disclaimer, the term of this patent is extended or adjusted under 35 U.S.C. 154(b) by 421 days.

(21) Appl. No.: 10/676,275

(22) Filed: Sep. 30, 2003

(65) Prior Publication Data

US 2005/0071042 A1   Mar. 31, 2005

(51) Int. Cl.
*G06F 19/00* (2006.01)

(52) U.S. Cl. .............. 700/212; 345/420; 700/182; 715/835

(58) Field of Classification Search .......... 700/212, 700/182, 160, 246, 249, 253, 259; 715/835, 715/848; 345/420, 169, 619, 652; 606/96; 219/130.1, 121.34, 130.21; 706/10, 49, 55, 706/904

See application file for complete search history.

(56) References Cited

U.S. PATENT DOCUMENTS

| | | | |
|---|---|---|---|
| 4,561,059 A | 12/1985 | Davis et al. | |
| 4,877,940 A | 10/1989 | Bangs et al. | |
| 5,040,125 A | 8/1991 | Okumura et al. | |
| 5,774,359 A | 6/1998 | Taneja | |
| 6,249,718 B1 | 6/2001 | Gilliland et al. | |
| 6,392,193 B1 * | 5/2002 | Mallenahalli et al. | 219/130.01 |
| 6,392,645 B1 * | 5/2002 | Han et al. | 345/420 |
| 6,445,388 B1 | 9/2002 | Subrahmanyam et al. | |
| 6,489,957 B1 * | 12/2002 | Han et al. | 345/420 |
| 6,515,258 B2 | 2/2003 | Corby et al. | |
| 6,583,386 B1 | 6/2003 | Ivkovich | |
| 6,629,011 B1 | 9/2003 | Calderon et al. | |
| 6,697,701 B2 | 2/2004 | Hillen et al. | |
| 6,795,778 B2 | 9/2004 | Dodge et al. | |
| 6,801,217 B2 * | 10/2004 | Andersson | 345/648 |
| 6,912,447 B2 | 6/2005 | Klimko et al. | |
| 7,050,960 B2 | 5/2006 | Hoelle et al. | |
| 2004/0010342 A1 | 1/2004 | Thelan | |
| 2004/0122550 A1 | 6/2004 | Klimko, et al. | |
| 2004/0129759 A1 | 7/2004 | Rouault et al. | |

OTHER PUBLICATIONS

Parametric Technology Corporation, "Pro/Engineer 2001, Pro/Welding Topic Collection".
Joe Greco, "A Visual Guide to Solid Edge 10," http://mcadvision.ibsystems.com/October2001/case_full.php.
Subrashekar, et al., "Feature Attributes and Their Role in Producting Modeling," Solid Modeling '95, Salt Lake City, Utah, 1995.
Computer & Automation Institute, "PROARC, No. 7831, CAD-Based Programming System for Are Welding Robots in One-Off Production Runs," ESPRIT, Jan. 16, 2001.
Wang, et al., "The Design and Fabrication of Welded Tubular Joints Using Solid Modeling Techniques," 2nd ACM Solid Modeling, 1993.

* cited by examiner

*Primary Examiner*—Kidest Bahta
(74) *Attorney, Agent, or Firm*—Fish & Richardson P.C.

(57) ABSTRACT

A computing environment is provided with the ability to at least contribute to the persistent naming of the divided sub-paths, including their edges and vertices, of a continuous path of an intermittent fillet weld bead, including the determination of an invariant weld bead generation direction.

30 Claims, 13 Drawing Sheets

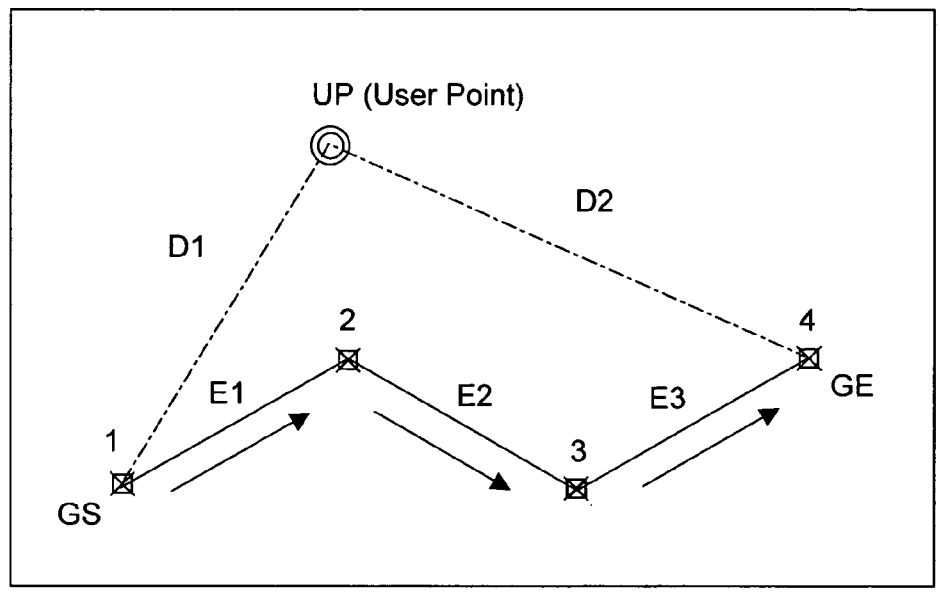
Figure 8a
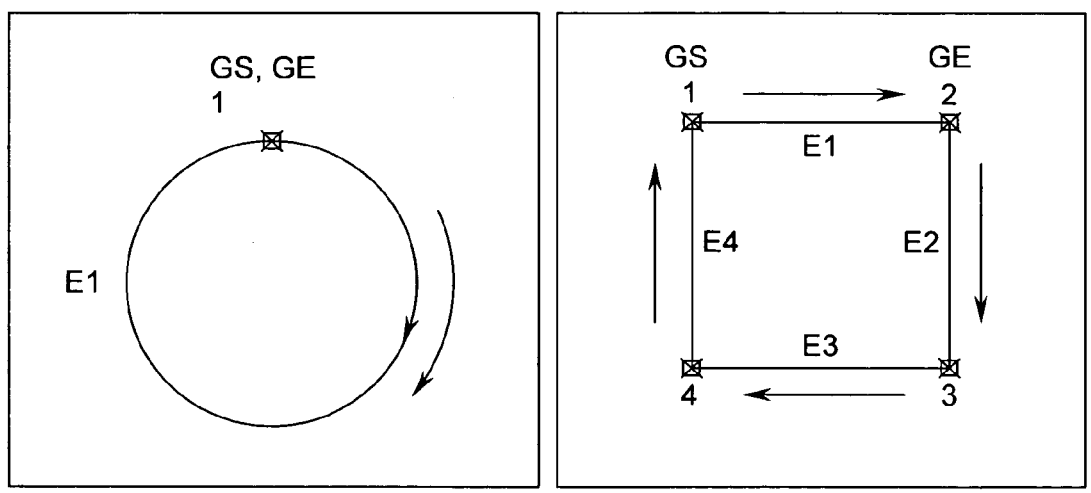
Figure 8b
Figure 8c

PERSISTENT NAMING FOR SUB-PATHS OF INTERMITTENT FILLET WELD BEADS

BACKGROUND

Advances in computing technology have made possible the provision of computer-aided-design (CAD) software to support the design and manufacturing of articles. Modern CAD software not only includes sketching or schematic features, but also solid modeling and other advanced features.

Manufacturing of articles often involves the welding of two or more components of an article into one single piece. A variety of welding types may be employed, including but not limited to intermittent fillet welds. Accordingly, it is desirable for CAD software to support modeling of welds, in particular, intermittent fillet welds. A modeled weld is often refers to as a weld bead. In the modeling of intermittent fillet weld, it is important that the topological entities are uniquely named, and these names are persistent across re-computations of the models, due to topological changes resulting from e.g. user edits, modifying the weld bead parameters, such as the number of weld bead instances. The requirements of persistent names are that they should be unique and invariant under topology changes.

A few commercial CAD systems offer support for representing welds. Externally, the support includes highlighting and/or labeling of the edges of the components involved. However, the method in which this functionality is provided is proprietary, and not known. In particular, it is unknown how the topological entities of an intermittent fillet weld bead are named.

BRIEF DESCRIPTION OF THE DRAWINGS

Embodiments of the present invention will be described referencing the accompanying drawings in which like references denote similar elements, and in which:

FIGS. 8a–8c illustrate three examples of Global Start Vertex (GS) and Global End Vertex (GE) of FIG. 6;

DETAILED DESCRIPTION OF EMBODIMENTS OF THE INVENTION

Embodiments of the present invention include, but are not limited to, methods to name sub-paths, including their edges and vertices, of an intermittent fillet weld bead in a computing environment, instructions implementing or contributing to the implementation of the methods, components, devices and systems incorporated with one or more implementations.

In the following description, various aspects of embodiments of the present invention will be described. However, it will be apparent to those skilled in the art that embodiments of the present invention may be practiced with only some or all aspects described. For purposes of explanation, specific numbers, materials and configurations are set forth in order to provide a thorough understanding of these embodiments of the present invention. However, it will be apparent to one skilled in the art that various embodiments of the present invention may be practiced without the specific details. In other instances, well-known features are omitted or simplified in order not to obscure the disclosed embodiments of the present invention.

Various operations will be described as multiple discrete operations in turn, in a manner that is helpful in understanding these embodiments of the present invention, however, the order of description should not be construed as to imply that these operations are necessarily order dependent. In particular, these operations need not be performed in the order of presentation.

The phrase "in one embodiment" is used repeatedly. The phrase generally does not refer to the same embodiment, however, it may. The terms "comprising", "having" and "including" are synonymous, unless the context dictates otherwise.

Figure 1:
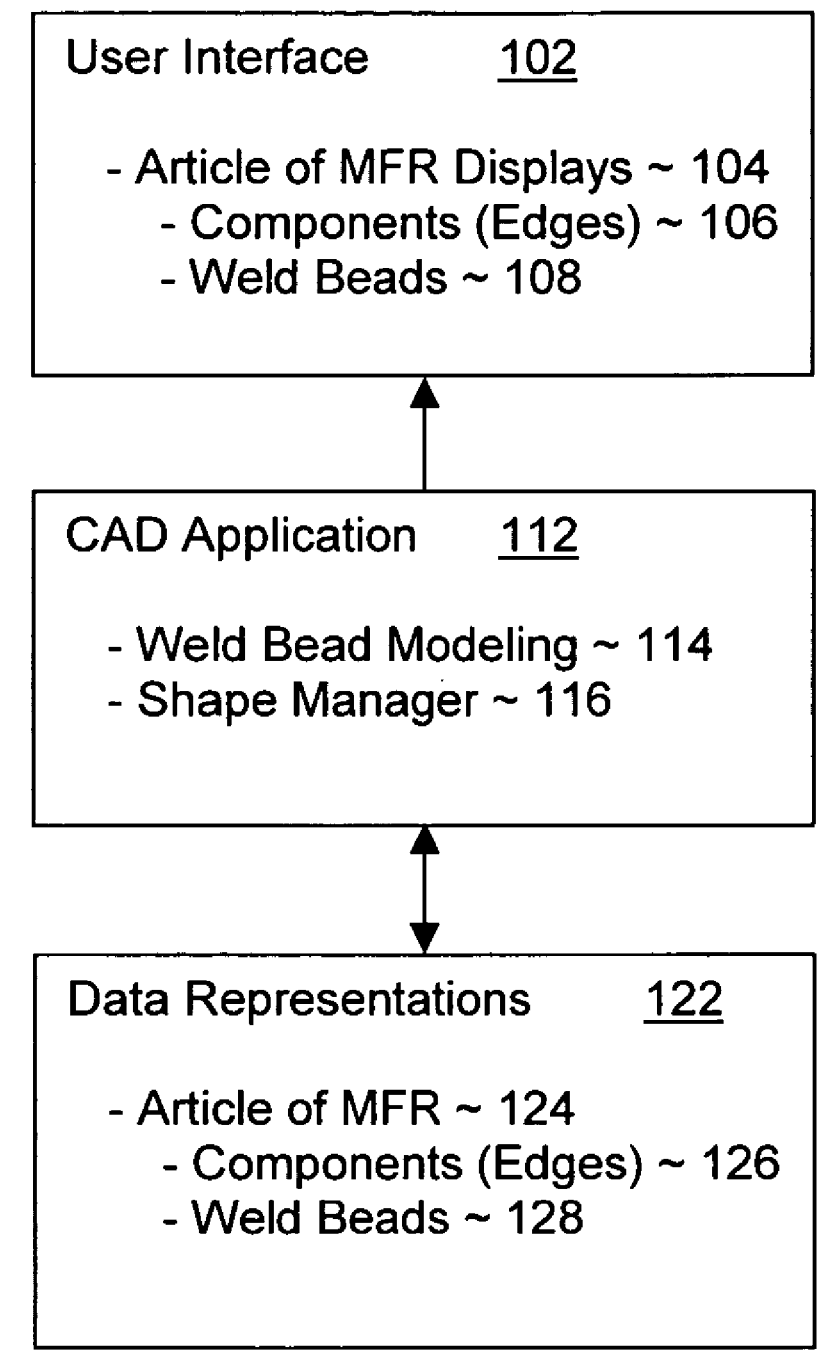
FIG. 1 illustrates a computing environment incorporated with one embodiment of the present invention.

Referring now to FIG. 1 wherein a computing environment incorporated with one embodiment of the present invention is illustrated. As shown, for the embodiment, computing environment 100 includes CAD application 112, having associated user interface 102 and data representations 122. CAD application 112 includes a number of CAD functions, in particular, weld bead modeling function 114 and shape manager 116. The various CAD functions, including weld bead modeling function 114 and shape manager 116 are equipped to create, process and delete various data representations 122 of features of articles of manufacture, including in particular, data representations 126 of their components and edges, and data representations 128 of weld beads. Resultantly, articles of manufactures may be modeled 124, and displayed 104 in user interface 102, including their components, edges and weld beads, 106 and 108.

Except for weld bead modeling function 114, CAD application 112 including shape manager 116 represent a broad range of these elements, and may be implemented in a number of manners. For example, CAD application 112 may be implemented using the Inventor ® 7 (also referred to as Autodesk Inventor Series) mechanical design software product available from Autodesk Inc. of San Rafael, Calif.

In alternate embodiments, CAD application 112 including shape manager 116 may be implemented with other CAD applications with integral geometric modeler, or other CAD applications employing a complementary standalone geometric modeler.

Similarly, data representations 122 may be implemented in a variety of manners, including but are not limited to link lists, relational tables, data objects, and other data organizations/structures of the like. Likewise, user interface 102 may be implemented in any one of a number of manners, in particular, a graphical manner.

Figure 2A:
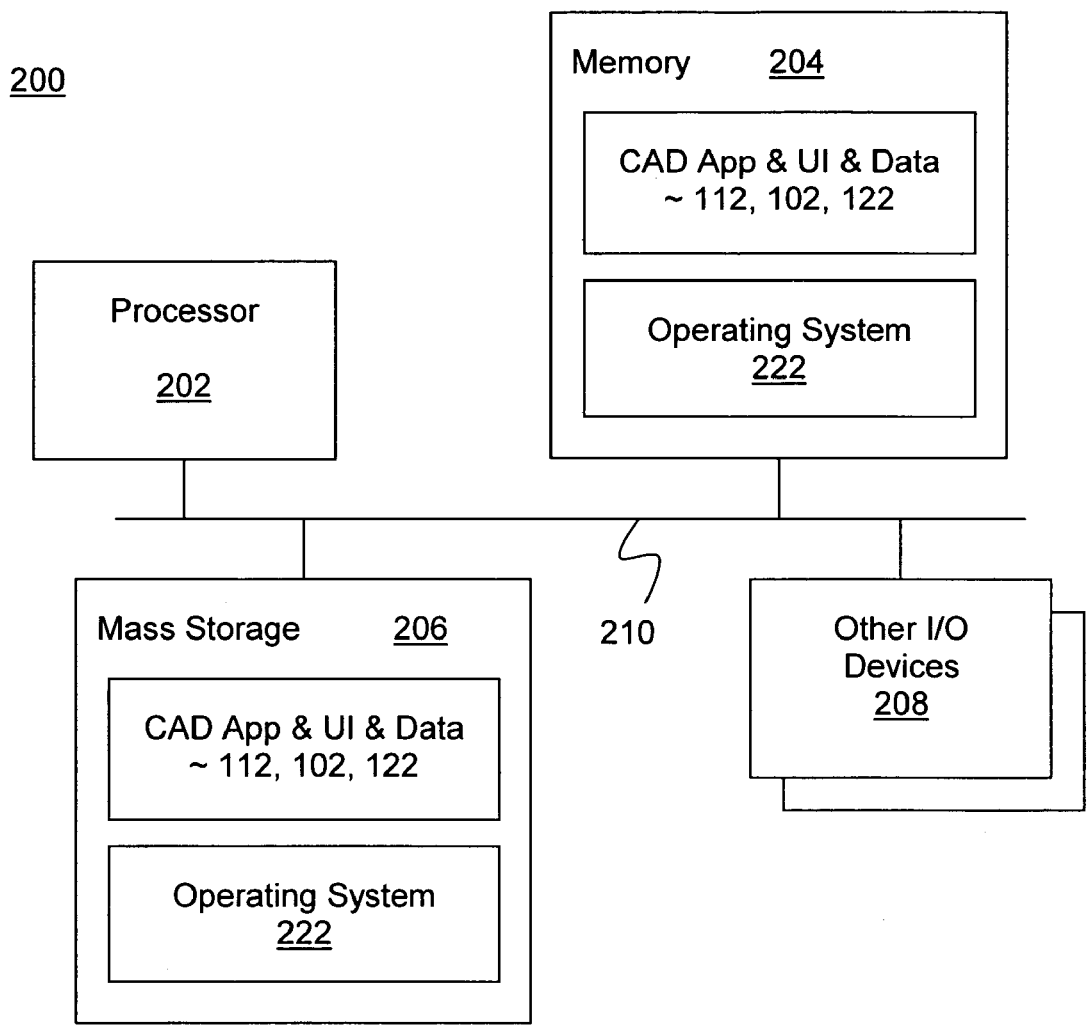
FIGS. 2a–2b illustrate two examples of computing environments of FIG. 1.

FIG. 2a illustrates one embodiment of computing environment 100 of FIG. 1. As illustrated, for the embodiment, computing environment 100 is a computing device 200 incorporated with one embodiment of the present invention. More specifically, computing device 200 includes processor 202, memory 204, mass storage device 206 and other I/O devices 208, coupled to each other via bus 210, as shown.

Memory 204 and mass storage device 206 include a transient working copy and a persistent copy of CAD application 112, including associated user interface 102 and data representations 122 of FIG. 1. Further, for the embodiment, memory 204 and mass storage device 206 include a transient working copy and a persistent copy of operating system 222, providing a number of system services to CAD application 112.

Processor 202, memory 204, mass storage 206, I/O devices 208, and bus 210 represent a broad range of such elements.

In other words, except for CAD application 112 endowed with weld bead modeling function 114, computing device 200 represents a broad range of such devices, including but are not limited to a server, a desktop computer, a computing tablet, a laptop computer, a palm sized personal assistant, a pocket PC, or other computing devices of the like.

Figures 2B, 3:
FIG. 3 illustrates an example machine readable article having instructions implementing all or portions of the CAD application of FIG. 1.

FIG. 2b illustrates another embodiment of computing environment 100 of FIG. 1. As illustrated, for the embodiment, computing environment 100 is a networked computing environment 250 including client device 252 and server 256 coupled to each other via network 254.

Collectively, client device 252 and server 256 are equipped with an embodiment of CAD application 112, including associated user interface 102 and data representations 122. In otherwords, CAD application 112, including associated user interface 102 and data representations 122 are distributively disposed on client device 252 and server 256. In various embodiments, client device 252 and server 256 may be computing device 200 of FIG. 2a.

Similarly, network 254 represents a broad range of local area, wide area, private and/or public networks. An example of a public network is the Internet.

FIG. 3 illustrates a machine readable article suitable for use to store executable instructions implementing all or portions of the CAD application 112 of FIG. 1, including weld bead modeling function 114, in accordance with one embodiment. For the embodiment, the machine readable article includes storage medium 300 and instructions implementing all or portions of CAD application 112, including weld bead modeling function 114, stored therein. The stored instructions may be used to program an apparatus, such as computing device 200 of FIG. 2a, or client device 252 and/or server 254 of FIG. 2b.

In various embodiments, the instructions may be C or C++ programming language instructions or other system programming language instructions of the like. Further, storage medium 300 may be a diskette, a tape, a compact disk (CD), a digital versatile disk (DVD), a solid state storage devices, or other electrical, magnetic and/or optical storage devices of the like.

Figure 4:
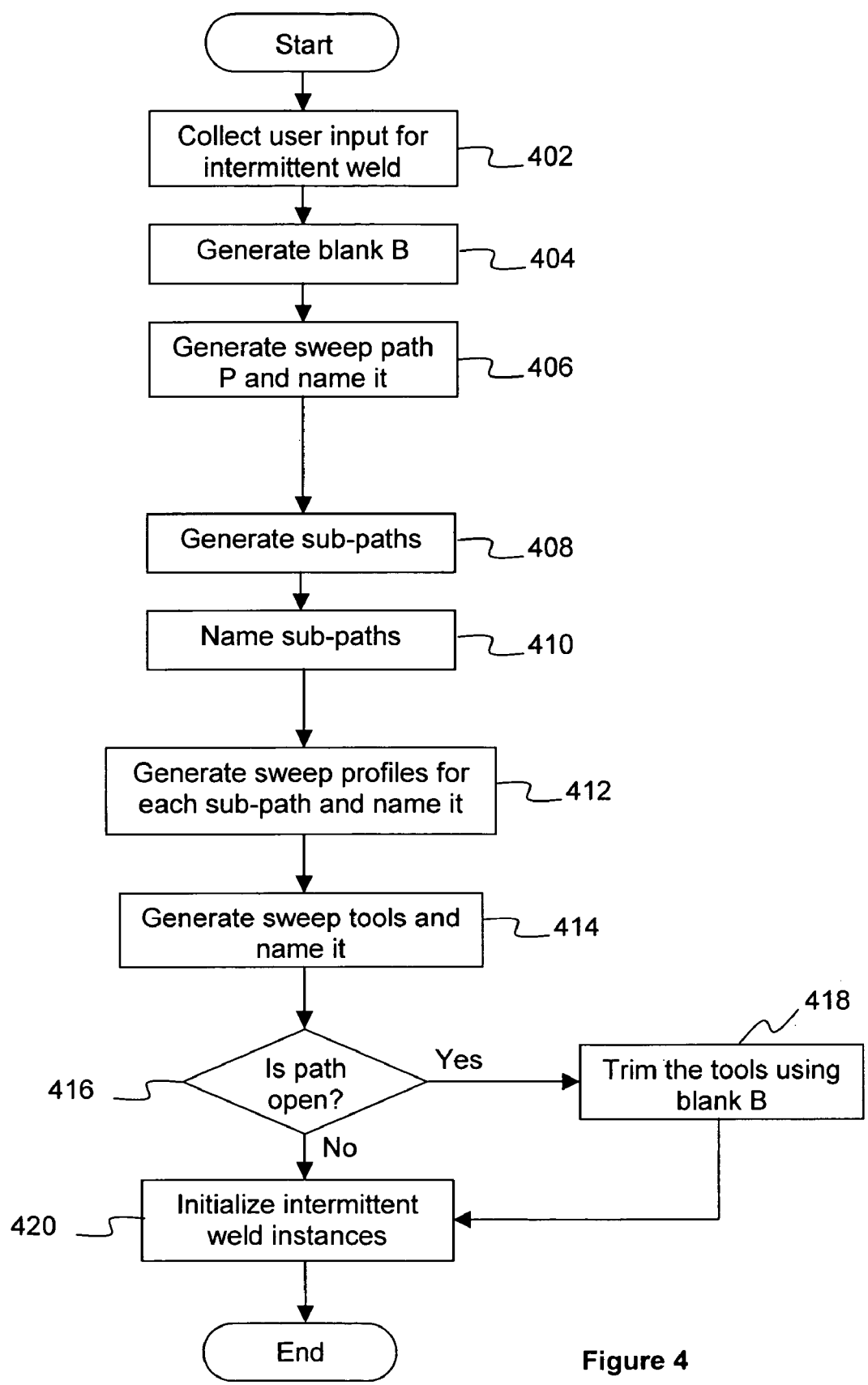
FIG. 4 illustrates one embodiment of the operational flow of the weld bead modeling function of FIG. 1 for generating an intermittent fillet weld bead.

FIG. 4 illustrates one embodiment of the operational flow of weld bead modeling function 114 of FIG. 1. The embodiment assumes CAD application 112 includes the functions for facilitating entry into a weld modeling mode of operation, where on entry, weld bead modeling function 114 is invoked. Further, CAD application 112 includes the functions for facilitating selection of the edges and/or faces (FS1, FS2) of the components of an article of manufacture involved in a particular welding operation (including e.g. the weld type and the weld parameters) to weld the components of the article together during manufacturing. For example, CAD application 112 may include support to facilitate a user in making the selection using a cursor control device, such as a mouse, trackball, a touch pad and so forth. The support may leverage user input device services provided e.g. by operating system 222.

As illustrated, in block 402, on or after selection, weld bead modeling function 114 first collects the user input for the intermittent fillet weld (hereinafter simply intermittent weld). In block 404, weld bead modeling function 114 generates a blank B. In one implementation, blank B is the result of a unite operation performed using a shape manager call, of all the copies of the components along which the intermittent weld will be generated. Then, in block 406, weld bead modeling function 114 generates and names path P. In one implementation, path P is generated from the blank B by collecting all the edges that have FS1 and FS2 as adjacent faces. These edges are copied and united to produce a wire-body, i.e. path P, using shape manager calls. In other words, path, P is a single non-degenerate piece which is continuous, un-branched and has no self-intersections.

In blocks 408–410, weld bead modeling function 114 divides path P into sub-paths, and names the sub-paths including their edges and vertices, to be described more fully below. The actual curve splitting to generate the sub-paths is done using a shape manager call.

Then, in block 412, for each sub-path, weld bead modeling function 114 generates (using shape manager calls) and names a sweeping profile. In block 414, for each sub-path, weld bead modeling function 114 generates and names a sweep tool. In one implementation, a sweep tool is generated through a sweeping operation of the sweeping profile along the corresponding sub-path, using a shape manager call.

In block 416, weld bead modeling function 114 determines whether the path is open. If the path is determined to be open, weld bead modeling function 114 correspondingly trims the sweep tools using shape manager calls, with their associated blanks B, and then initializes the trimmed sweeping tools as intermittent fillet weld bead instances, blocks 418–420.

Note that all operations within computing environment 100, in substance are performed on data representations 122 of the faces, edges, vertices, blanks, paths, and tools. For ease of understanding, further description may not be burdened with the repeated clarification. However, the description should be so read, unless the context clearly indicates otherwise.

Figure 5:
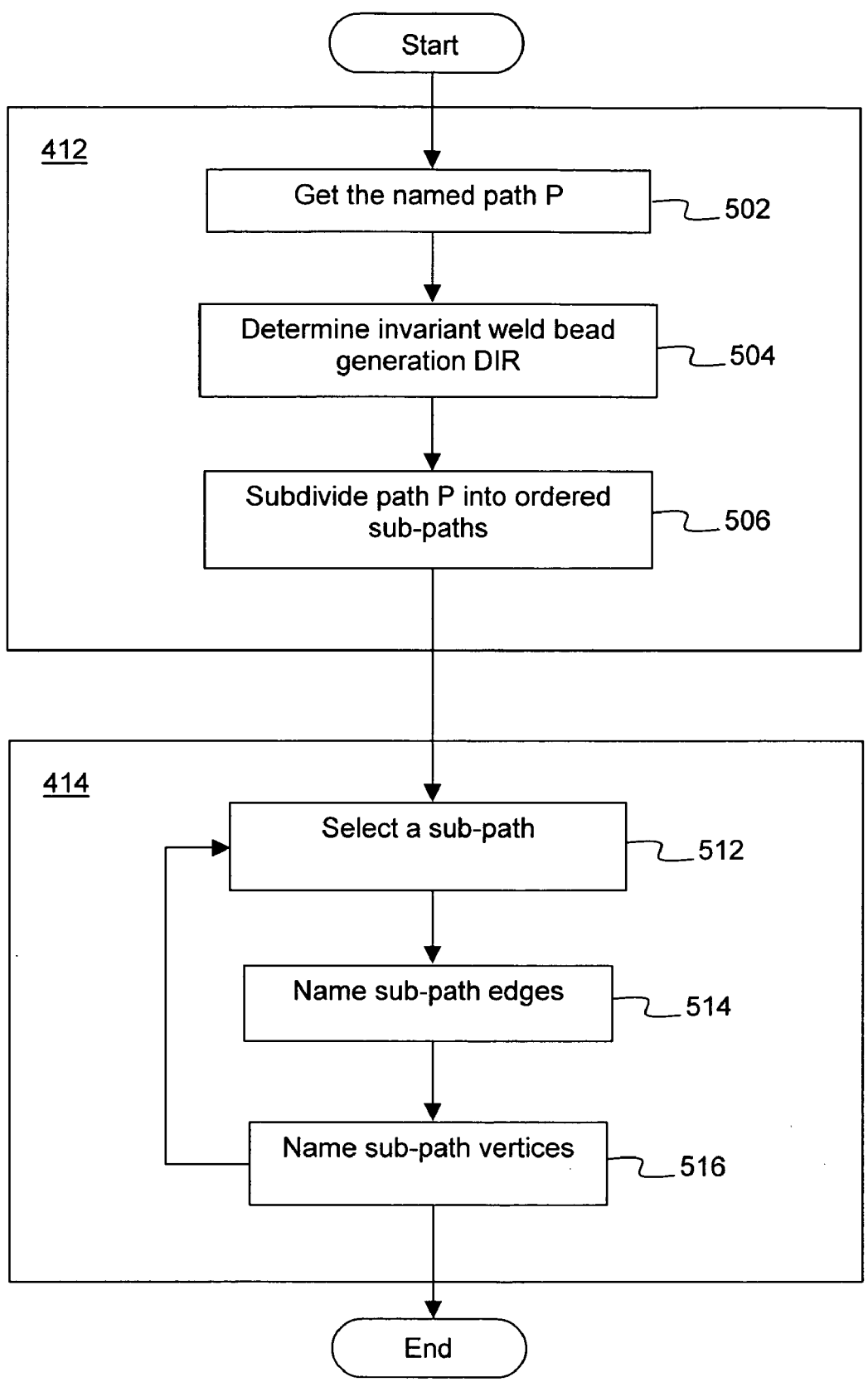
FIG. 5 illustrates one embodiment each for the sub-path generating and naming operations of FIG. 4 in further details.

FIG. 5 illustrates the sub-path generation and naming operations of FIG. 4 in further details, in accordance with one embodiment. As illustrated, weld bead modeling function 114 gets the named path P, block 502, and determines an invariant weld generation direction, block 504. In various implementations, the determination includes the identification of a Global Start Vertex (GS) and a Global End Vertex (GE). Then, in block 506, weld bead modeling function 114 sub-divides path P into ordered sub-paths. In various implementations, path P is sub-divided into equal length segments (edges with vertices), placed at distance d from each other. In various embodiments, the sub-division is effectuated by calling a curve splitting function of the shape manager.

Then, weld bead modeling function 114 performs blocks 512–516 for each sub-path. More specifically, at block 512, a sub-path is selected. Then, the edges and vertices of the selected sub-path are named, blocks 514–516.

Figure 6:
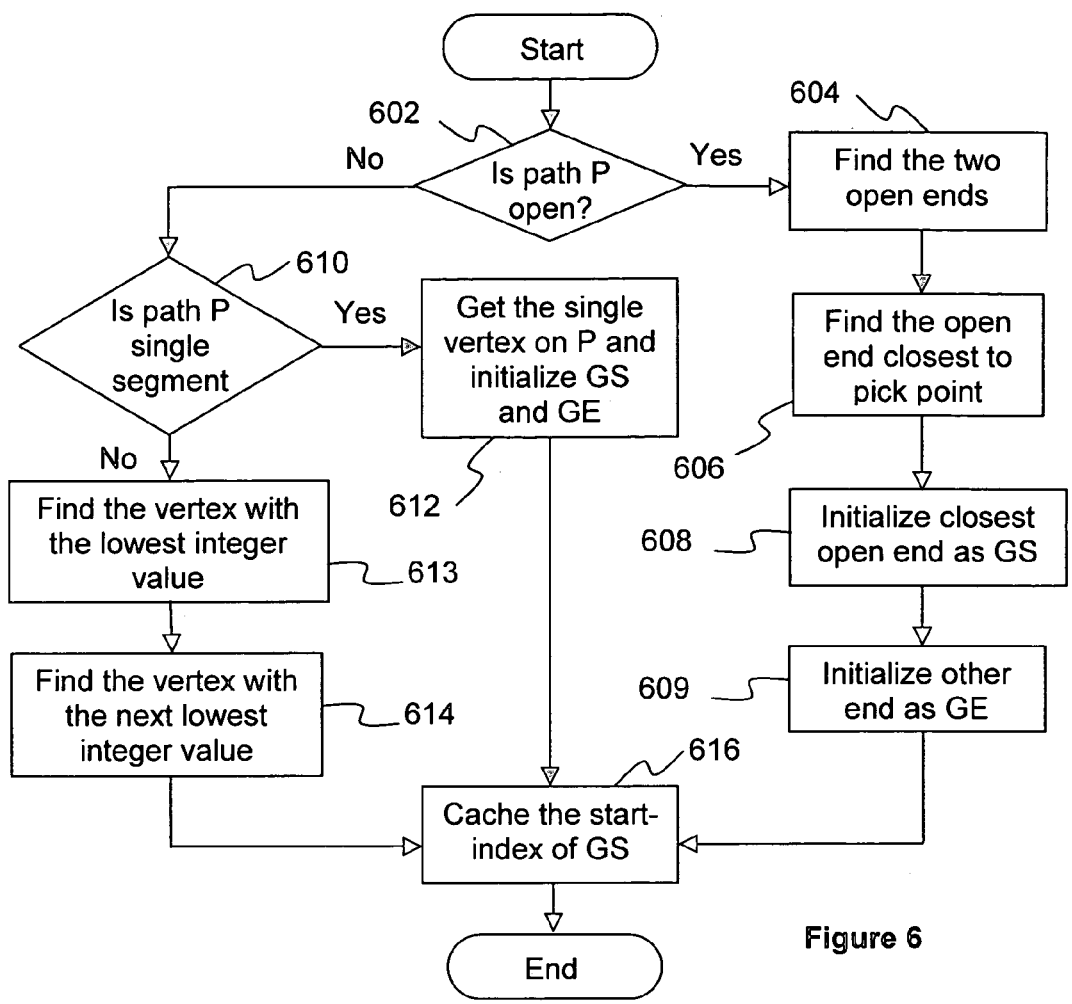
FIG. 6 illustrates the invariant weld generation direction establishment operation of FIG. 5 in further details, in accordance with one embodiment.

FIG. 6 illustrates the invariant weld generation direction determination operation of FIG. 5 in further details, in accordance with one embodiment. The embodiment assumes the following:

Intermittent fillet welds are generated along Face-Sets (namely FS1 and FS2) that either belongs to the same component or two different components.

All faces in a given Face-Set (e.g. FS1) are unique and belong to the same component. A face cannot belong to both face-sets.

The path, P, is named such that each of its edges is uniquely named. All vertices of the named path P are assumed to be tagged uniquely from '1' through 'n'.

Intermittent Fillet Weld Instances are of equal length placed along a continuous path and are equidistant from each other.

The path is a single, non-degenerate, continuous and un-branched entity. However, the path may be open or closed.

User defined pick point is provided by the user during selection of input face-sets FS1 and FS2.

Further, the "attributes" referred herein may have copy, split and merge behaviors, which can be specified. Attribute propagation and management services are available from the earlier identified shape manager or its equivalent. In alternate embodiments, this need may be addressed by any attribute or callback notification method that provides notification of model changes.

For the embodiment, to establish the invariant path direction, weld bead modeling function 114 establishes the global start (GS) and end (GE) vertices for the named path. As will be readily apparent from the descriptions to follow, GS and GE play an important part in generating consistent names for the sub-paths. The global start vertex GS identifies the logical start of the path P and the global end vertex GE identifies the logical end. GS and GE are associated with unique integers known as the start-index (start vertex name, i.e., unique integer value at the start of P) and end-index (end vertex name, i.e., unique integer value at the end of P). These names are termed as an index because they are used to identify GS and GE, which signify the path's direction along which the intermittent fillet weld will be generated. Thus, the start and end index together with the topology of path P are used to facilitate the establishment of order, i.e. unique direction in an otherwise unordered set of vertices of the path, P. This direction is invariant over successive re-computes of the model.

To facilitate enforcement of the invariant direction, the start-index of the Global Start Vertex is cached, and made persistent. Over successive re-computes of the model, the GS vertex is identified using the cached start-index. As a result, the Global Start Vertex and Global End Vertex may be set to match the same vertices over different computes of the model. In turn, that characteristic serves to maintain an invariant weld bead generation direction, as well as guarantee that the names for the sub-paths, and eventually the weld instances will be the same.

Referring now to FIG. 6, during creation of the sub-paths, weld bead modeling function 114 first determines whether path P is open or closed, block 602. GS and GE are then identified based on the path type.

If path P is determined to be open, path P, by definition, has two open ends. Accordingly, weld bead modeling function 114 first locates the two open ends, block 604. Then, weld bead modeling function 114 determines which one of the two open ends is closest to the user's pick pint, block 606 (see also FIG. 8a). In various implementations, weld bead modeling function 114 selects the vertex that is closest to the user's pick point as GS (the user's pick point is an actual point on the face where the user clicked first to select the faces to weld), block 608. Additionally, weld bead modeling function 114 selects the other open end as GE, block 609.

In some cases, the two open ends could be at equal distances to the user-selected pick point. In various implementations, weld bead modeling function 114 arbitrarily chooses one of the points as GS.

If path P is determined to be closed, weld bead modeling function 114 proceeds to determine whether path P is a single or multiple segment path, block 610. A closed single segment path has only one vertex (see also FIG. 8b). In various implementations, weld bead modeling function 114 initializes that single vertex as both GS and GE, block 612. For closed multi-segmented paths (see also FIG. 8c), weld bead modeling function 114 determines the vertex whose name value is the lowest and the next lowest. In various implementations, the vertex names are integers. Weld bead modeling function 114 selects the vertex with the lowest value as GS, block 613, and the vertex with the next lowest value as GE, block 614.

Regardless of, whether path P is open, or a closed single/multi segment, after selection, the start-index of GS is cached/stored, block 616. As will be described in more detail below, the cached/stored GS facilitates establishment of the invariant weld bead generation direction, and in turn, facilitates the persistent and proper naming of the sub-paths during re-computes of the model (due to e.g. user editing and modification to the weld parameters).

As will be described in more detail below, during edits, weld bead modeling function 114 retrieves the cached value of the start-index. If the path is open, weld bead modeling function 114 finds the vertex in the path whose name value matches with the start-index. The matched vertex is initialized as GS. The other open end is initialized as GE. If the path is closed, and has one segment, weld bead modeling function 114 initializes the only vertex as GS and GE. If the path is closed and has multiple segments, weld bead modeling function 114 uses the start-index to find the GS. Weld bead modeling function 114 then obtains the two neighboring edges around GS and collects all the candidate vertices except the vertex whose name is GS. From the two candidate vertices, weld bead modeling function 114 finds the vertex that has the lowest integer value and initializes it as GE.

Figure 7A:
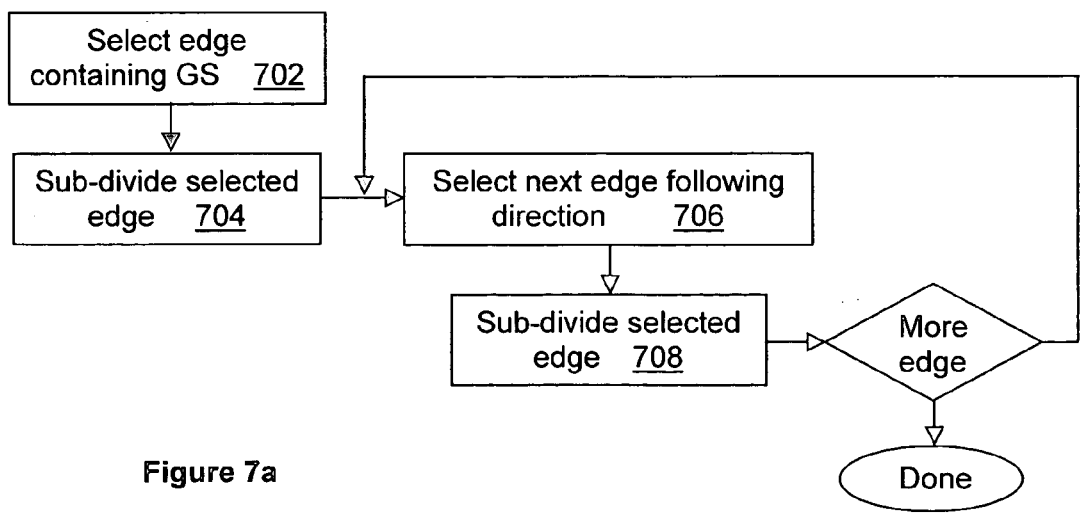
FIGS. 7a–7b illustrates the persistent edge and vertex naming operations of FIG. 5 in further details, in accordance with a respective embodiment.

FIG. 7a illustrates the sub-division operation of FIG. 5 in further details, in accordance with one embodiment. For the embodiment, given a multi-edge continuous path P, the edge that contains the GS vertex is used to identify the first edge for subdivision. Accordingly, weld bead modeling function 114 first selects the edge containing GS, block 702, and sub-divides the selected edge, block 704. In various implementations, as described earlier, the sub-division is performed by weld bead modeling function 114 invoking a curve splitting function. In various implementations, the curve splitting function is available from the shape manager.

Figure 9A:
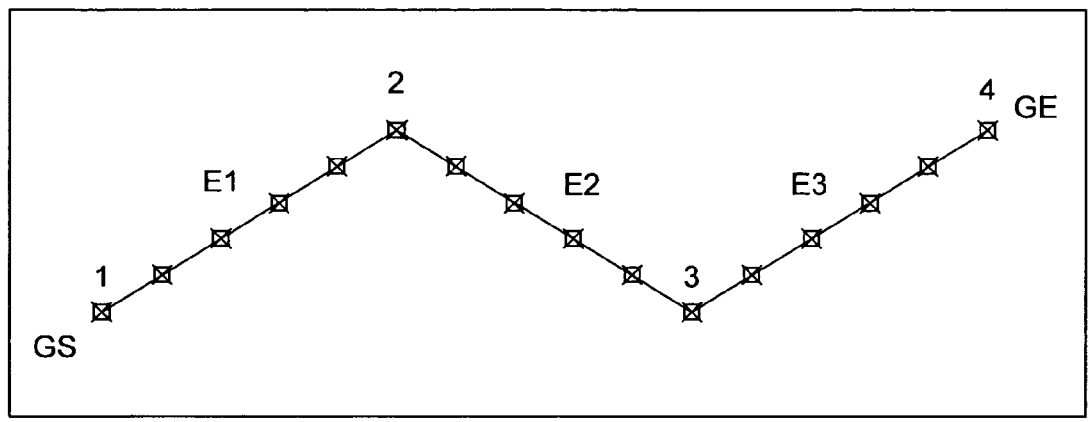
FIGS. 9a–9b illustrate an example of a path being divided into sub-paths.
Figure 9B:
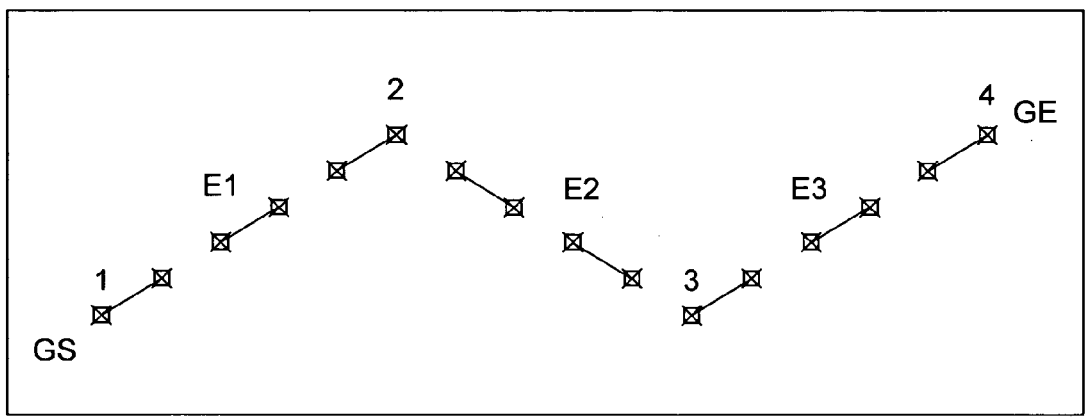

Then, weld bead modeling function 114 selects the next connected edge, in accordance with the invariant weld generation direction, block 706, and subdivides that edge, block 708. The process is repeated until all edges have been subdivided. (See also FIGS. 9a–9b)

In various implementations, for a multi-edge path where the edges are numbered 1–n, the GS Vertex is considered to be attached to edge 1. Thus, the above process may be re-stated as having weld bead modeling function 114 first selects and sub-divides edge 1, then moves to edge 2, and so forth, until edge n is selected and sub-divided.

Accordingly, the edge subdivision process results in a number of sub-paths. These sub-paths along with the sweeping profiles will be used to generate the intermittent fillet weld instances.

Figure 7B:
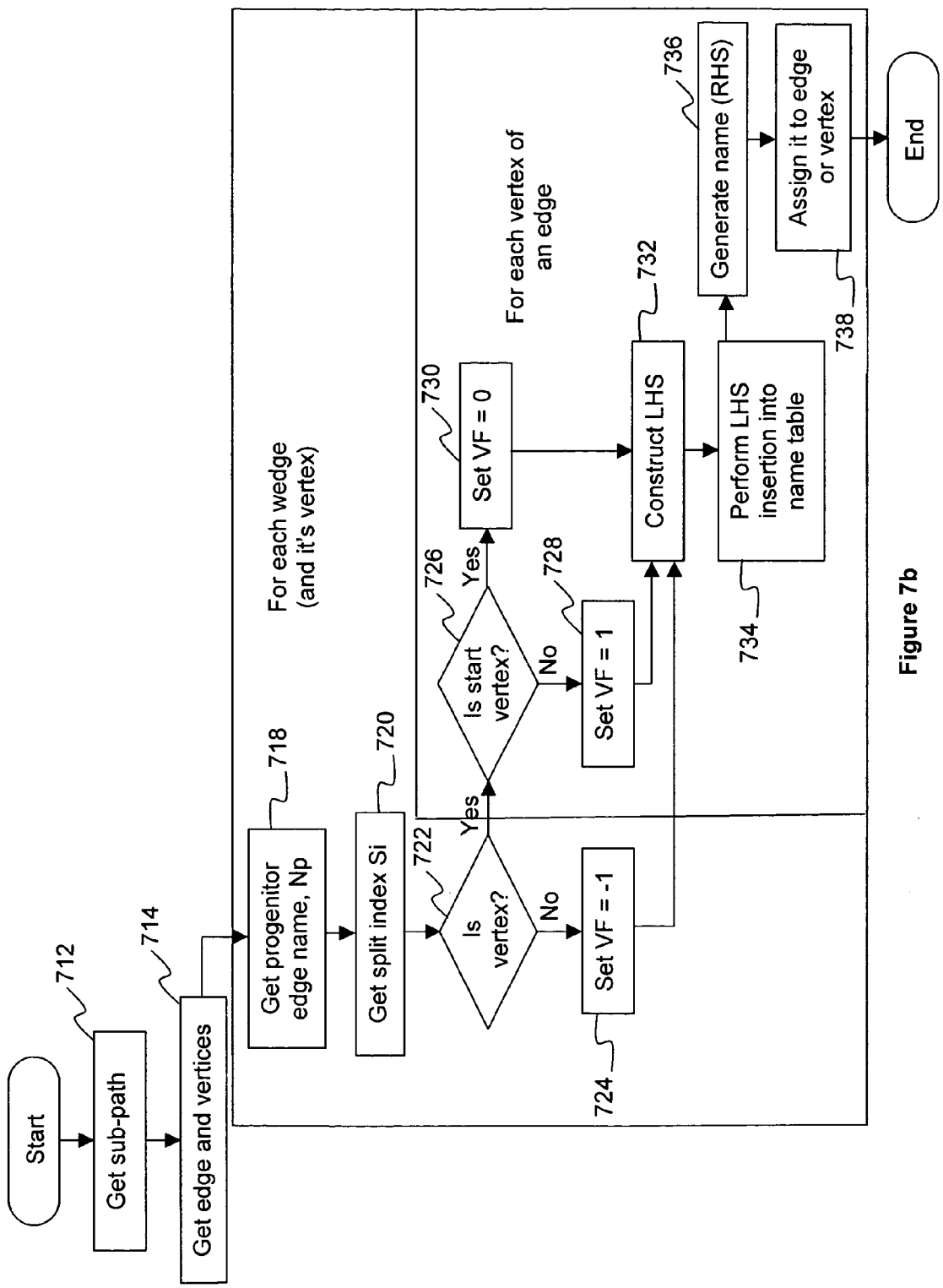

FIG. 7b illustrates the naming operations of FIG. 5 in further detail, in accordance with one embodiment. In various embodiments, a persistent table referred to as the name table, which contains non-duplicate rows and two columns (Column 1, and Column 2) is employed. The table has certain abilities. One such ability is known as Insertion. Given a n-tuple of "access" data D in Column 1, Left Hand Side (LHS), the table function can generate a unique Right Hand Side (RHS) integer value. In the Insertion function, given "access" data D, If a match exists for D in any row in Column 1, it retrieves and returns the corresponding Right Hand Side (RHS) value in Column 2 for the same row.

If a match does not exist for D in any row in Column 1, it inserts the given data in Column 1 (LHS) into a new row at the end and generates a unique integer in Column 2 for the same row known as the RHS value.

An example of the table is shown below.

A name $N_{e/v}$, for the edge or the vertex of a sub-path is generated by constructing the LHS value as a 3-tuple using the following:

| | |
|---|---|
| $N_p$: | Name of the progenitor edge, |
| $S_i$: | Split-index. |

VF:. Vertex-flag is equal to −1 when we are naming an edge. For naming a vertex, Vertex Flag is equal to 0 for a start vertex and 1 for the end vertex of each sub-path.

$$\{N_p, S_i, VF\} \ldots = N_{e/v} \qquad \text{Eq. 1}$$

As shown in Eq 1, the name $N_{e/v}$ for an edge or vertex is deduced by the 3-tuple on the LHS. The RHS value is the resulting name for the edge or vertex.

When a new name needs to be generated, weld bead modeling function 114 inserts the LHS value into the name table. For the LHS value, the name table returns a RHS value. The next time the weld bead is re-computed, if the LHS value matches, the table function returns the existing names. In various implementations, if the user changes input data such that it results in fewer sub-paths, the unused sub-path names are not deleted. Instead they are left in the table for later reuse. However, if the weld bead is completely destroyed, the table is destroyed.

The ordered sub-paths are processed sequentially. Each edge is named first followed by its vertices. The process continues for all the remaining edges in the sub-paths.

Referring now to FIG. 7b, weld bead modeling function 114 first selects a sub-path, including its edge and vertices, blocks 712–714. Then, for each edge and vertex on the sub-path, weld bead modeling function 114 generates a name for it by constructing a 3-tuple on the LHS and then using the Insertion function in the name table to get a unique integer on the RHS, and assigns to the edge/vertex, blocks 718–738.

For the LHS value, weld bead modeling function 114 first obtains the name of the progenitor edge $N_p$, block 718. In various implementations, $N_p$ is deduced through the attributes on the split edge. More specifically, for these implementations, every edge of the path P has an attribute (known as EntityNameAttribute), which contains the unique edge name, $N_e$.

When an edge of path P is split into multiple sub-paths, resulting in sub-path edges, the original name of the edge is copied onto each edge of the sub-path by virtue of the split behavior. This is useful in preserving the relationship between a sub-path's edge and its progenitor edge. From the sub-path's edge the EntityNameAttribute is obtained, and then from this attribute the name of the progenitor edge, $N_e$ is obtained.

In various implementations, during the creation of the sub-paths, the curve splitting function also attaches a split-attribute to the edges of path P which contains information about the split index of the sub-path. For these implementations, weld bead modeling function 114 retrieves the split index $S_i$, from the split attribute on the edges of the sub-path, block 720. The split index signifies the order in which the segments were split.

At block 722, weld bead modeling function 114 determines whether the topological items to be named is a vertex. If not, weld bead modeling function 114 sets the vertex flag to −1 (for an edge), block 724. Then, weld bead modeling function 114 constructs the LHS value, block 732. In various implementations, the construct is performed as shown in Equation 1. Further, weld bead modeling function 114 performs insertion into the name table, block 734, resulting in a RHS name being generated by the table function, block 736. The unique integer resulting from the LHS value is then assigned to the edge, block 738.

Then, weld bead modeling function 114 collects and processes all the vertices of the edge. At first, weld bead modeling function 114 identifies whether the vertex corresponds to a start or end vertex, block 726. In various implementations, this is deduced based on GS and GE. As before, the LHS value is constructed as shown in Equation 1, and the split index is collected from the edge that uses the vertex.

In blocks 728–730, weld bead modeling function 114 sets the Vertex Flag for a Start vertex to 0, and End Vertex to 1. The LHS value is inserted into the name table to get a RHS value as before, blocks 732–736. The RHS value is assigned to the unnamed vertex, block 738.

Figure 10A:
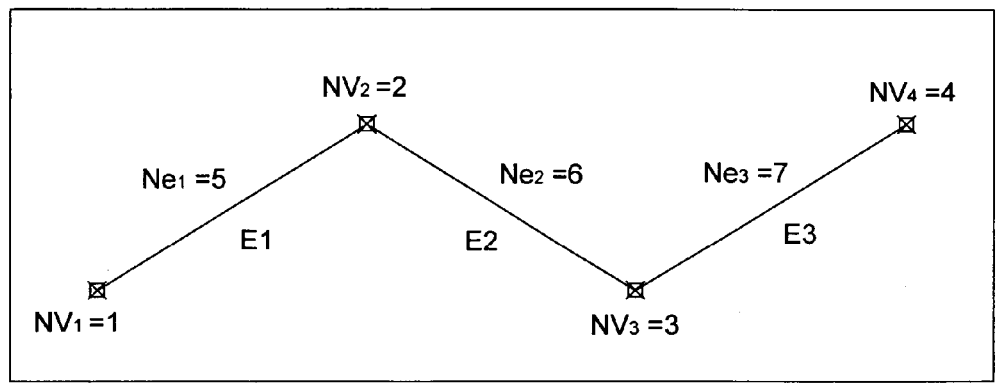
FIGS. 10a–10b illustrate an example naming of the path and the sub-paths, including their edges and vertices.
Figure 10B:
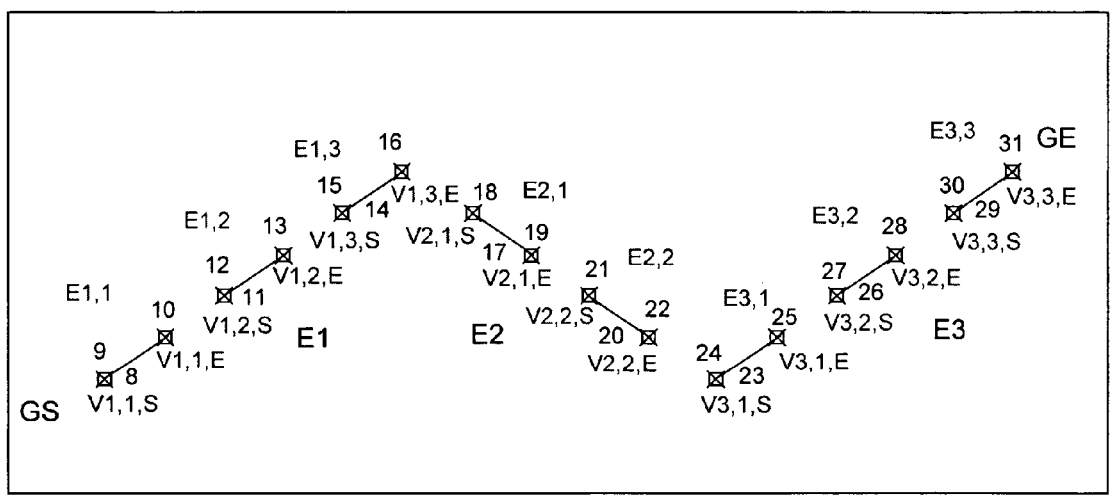

FIGS. 10a–10b illustrate an example of sub-path division and naming. The path P has 3 edges E1, E2, E3. E1 has an edge name of $N_{e1}$=5, E2's edge name is $N_{e2}$=6, and E3's edge name to be $N_{e3}$=7. The vertices of E1 are named as $Nv_1$=1, $N_{v2}$=2, vertices of E2 as $N_{v2}$=2 and $N_{v3}$=3 and vertices of E3 as $N_{v3}$=3 and $N_{v4}$=4 and GE are also shown in FIG. 10b.

After subdivision, the three path segments in FIG. 10a are subdivided into eight segments as shown in FIG. 10b.

The following table shows how names are generated for the sub-paths of E1.

|  |  | LHS value | | RHS value | |
| --- | --- | --- | --- | --- | --- |
| Object | Entity Type | $N_p$ | $S_i$ | VF | $N_{e/v}$ |
| E1, 1 | Edge | 5 | 1 | −1 | 8 |
| V1, 1, S | Start Vertex | 5 | 1 | 0 | 9 |
| V1, 1, E | End Vertex | 5 | 1 | 1 | 10 |
| E1, 2 | Edge | 5 | 2 | −1 | 11 |
| V1, 2, S | Start Vertex | 5 | 2 | 0 | 12 |
| V1, 2, E | End Vertex | 5 | 2 | 1 | 13 |
| E1, 3 | Edge | 5 | 3 | −1 | 14 |
| V1, 3, S | Start Vertex | 5 | 3 | 0 | 15 |
| V1, 3, E | End Vertex | 5 | 3 | 1 | 16 |

At first E1,1 is processed. Its 3-tuple is {5,1,−1} which results in a RHS value of 8. Next vertices, V1,1,S and V1,1,E are processed. For V1,1,S the 3-tuple is {5,1,0}. Note that the vertex flag is set to 0 since it corresponds to a start vertex. For, V1,1,E the 3-tuple is {5,1,1} which results in a edge name of 10. Since it corresponds to an end vertex its vertex flag is set to 1. Edge E1,2 has a 3-tuple of {5,2,−1}. Note that the Vertex Flag for this edge is −1 since it is not a vertex. By inserting this into the name table, an edge name of 11 is obtained. Since both vertices of Edge 1,2 are not named, the 3-tuples {5,2,0} and {5,2,1} result in names 12 and 13 respectively for the vertices V1,2,S and V1,2,E. This process continues until all the edges i.e. E1,3, E2,1, E2,2, E3,1, E3,2, E3,3, and their vertices are named.

Figure 11:
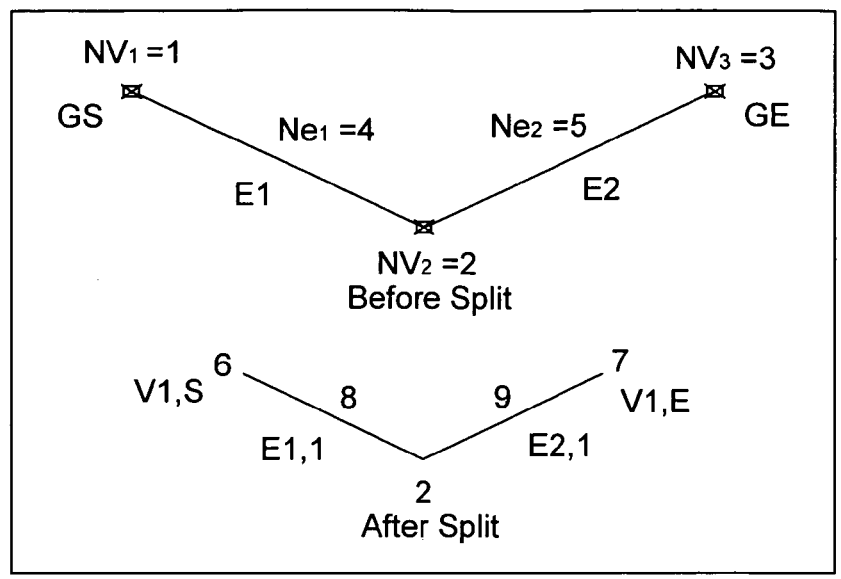
FIG. 11 illustrates a situation where after sub-division, a vertex remains a member of two edges.

Refer now to FIG. 11, as illustrated, in certain cases, the sub-path can span more than one vertex on path P. For the illustrated situation, the sub-path gets its progenitor edges in-part from E1 and in-part from E2. For example the vertex with name $N_{v2}$=2 on the path P, before split, remains in the sub-path generated after split. For the sub-path shown after split, the 3-tuple for the start vertex V1,S is {4,1,0} which results in a new name of 6. The 3-tuple for the end vertex V1,E is {5,1,1} which results in a new name of 7. Segments E11 and E21's 3-tuples correspond to {4,1,−1} and {5,1,−1} which correspond to edge names of 8 and 9.

Persistent naming methods should be consistent and exhibit robust behavior. Since a model can go through a number of geometry and topology changes due to user edits, the method preferably should ensure that the names generated are unique and invariant. This will ensure that any downstream features depending on the topological entity will update successfully.

Figure 12A:
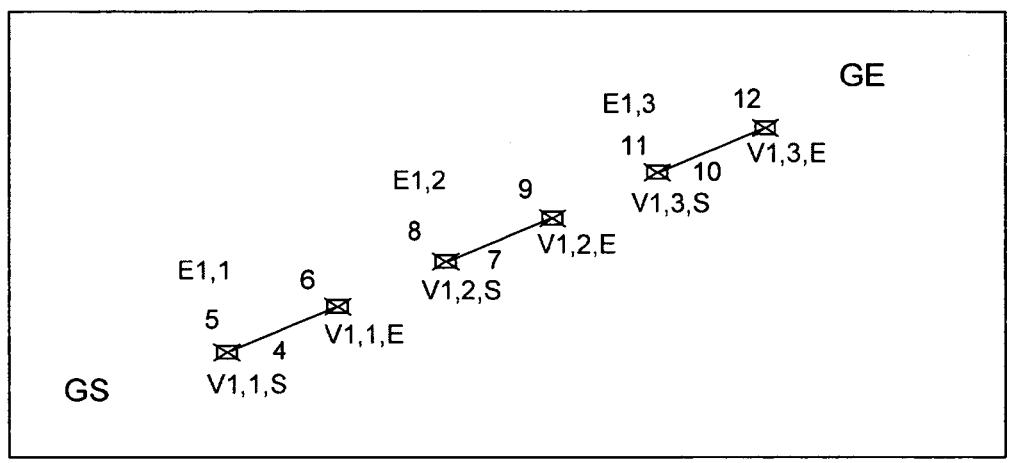
FIGS. 12a–12b illustrate two sub-path views of an example of persistent naming, across re-computations of an intermittent fillet weld bead model due to e.g. editing of the weld.
Figure 12B:
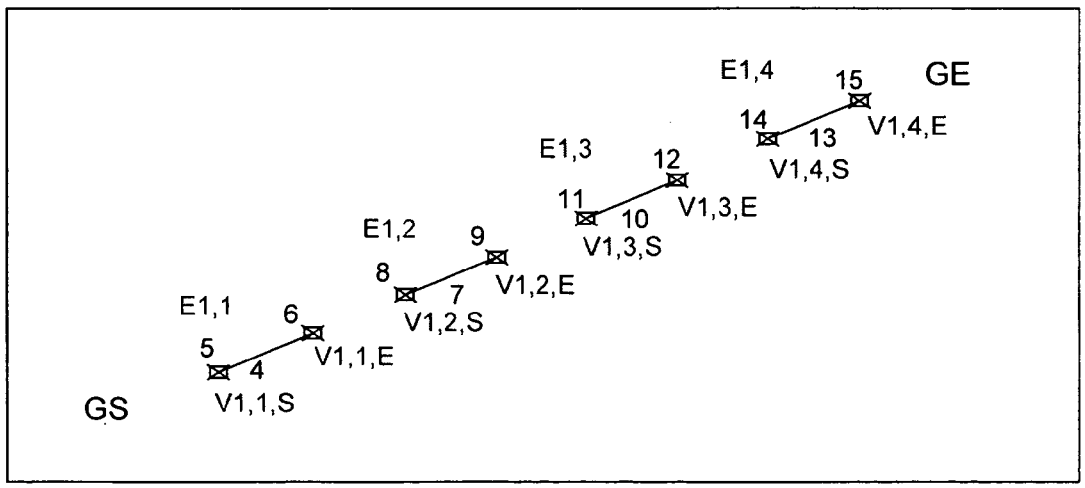

FIGS. 12a–12b illustrate two sub-path views of an editing example. FIG. 12a shows a path P having been sub-divided into 3 sub-paths, for the eventual generation of 3 intermittent fillet weld instances. The edges and vertices of the 3 sub-paths are named as described earlier.

The example assumes the weld parameters were edited by e.g. a user, changing the number of intermittent weld instances desired from 3 to 4. The names of sub-paths, including their edges and vertices, are re-computed in accordance with the earlier described method, and the results are shown in FIG. 12b As illustrated, by virtue of the invariant weld generation direction, and naming in accordance with the direction, the sub-path segments E1,1 and E1,2 and E1,3, and their corresponding vertices V(1,1,S), V(1,1,E), V(1,2,S), V(1,2,E), V(1,3,S), V(1,3,E) in FIG. 12a and in FIG. 12b get the same names. Sub-path E1,4 and its two vertices V(1,4,S) and V(1,4,E) in FIG. 12b, get new names. Edge E1,4, gets the name, 13, and vertices: V(1,4,S) and V(1,4,E) get the names 14 and 15 respectively.

The name table used to generate the names for the vertices and edges for the example shown in FIG. 12b is shown below.

|  |  | LHS value | | RHS value | |
| --- | --- | --- | --- | --- | --- |
| Object | Entity Type | $N_p$ | $S_i$ | VF | $N_{e/v}$ |
| E1, 1 | Edge | 3 | 1 | −1 | 4 |
| V1, 1, S | Start Vertex | 3 | 1 | 0 | 5 |
| V1, 1, E | End Vertex | 3 | 1 | 1 | 6 |
| E1, 2 | Edge | 3 | 2 | −1 | 7 |
| V1, 2, S | Start Vertex | 3 | 2 | 0 | 8 |
| V1, 2, E | End Vertex | 3 | 2 | 1 | 9 |
| E1, 3 | Edge | 3 | 3 | −1 | 10 |
| V1, 3, S | Start Vertex | 3 | 3 | 0 | 11 |
| V1, 3, E | End Vertex | 3 | 3 | 1 | 12 |
| E1, 4 | Edge | 3 | 4 | −1 | 13 |
| V1, 4, S | Start Vertex | 3 | 4 | 0 | 14 |
| V1, 4, E | End Vertex | 3 | 4 | 1 | 15 |

Note that the 3-tuple for edges E1, 1, E1, 2, E1, 3 and vertices V(1,1,S), V(1,1,E), V(1,2,S), V(1,2,E), V(1,3,S), V1, 3,E) are: {3,1,−1}, {3,2,−1}, {3,3,−}, for edges, {3,1,0}, {3,1,1,}, {3,2,0}, {3,2,1}, {3,3,0}, {3,3,1} for vertices respectively. These names are the same before and after edit. Hence, the naming table invariantly returns the same RHS values for these sets of 3-tuples, i.e. 4, 7, 10, for edges and 5, 6, 8, 9, 11, 12 for vertices respectively. Sub-path segment E1, 4 shown in FIG. 12b is a new segment due to the editing process. The edge's 3-tuple {3,4, −1} results in a new name of 13. The vertices' 3-tuples V(1,4,S) and V(1,4,E) will result in new names of 14 and 15 being returned. Thus the names are unique and invariant after successive compute operations.

Referring back to FIG. 4, as earlier described, after sub-paths are generated, and their edges and vertices are named, blocks 408–410, a sweeping profile is created and named, block 412, and the sweeping profile is employed to generate the sweeping tools, block 414. In turn, the sweeping tools are initialized as the intermittent weld bead instances (with or without having been trimmed using body B), blocks 418–420.

Figure 13A:
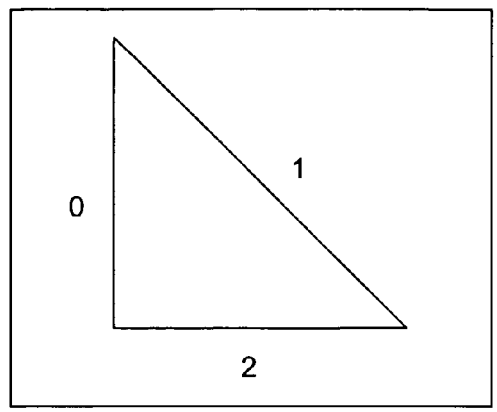
FIGS. 13a–13e illustrate an example triangular sweeping profile employed to generate an intermittent fillet weld bead having multiple weld bead instances; and various resulting weld beads.
Figure 13B:
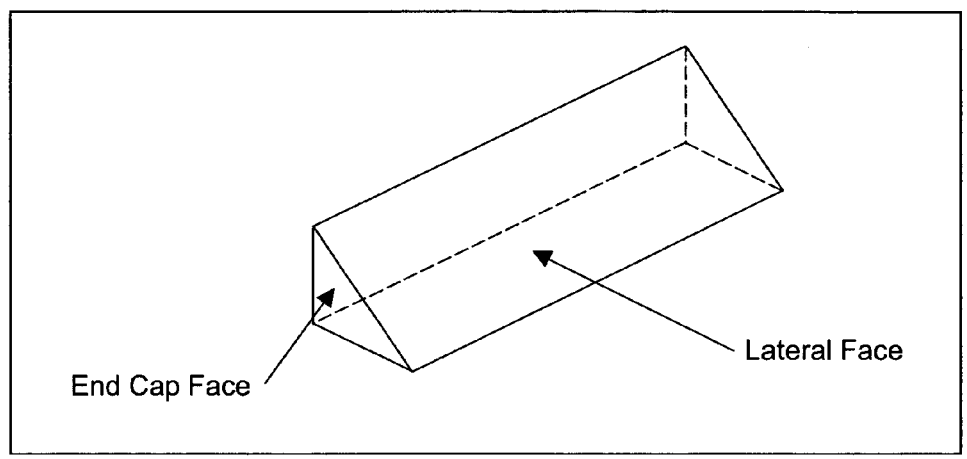
Figure 13C:
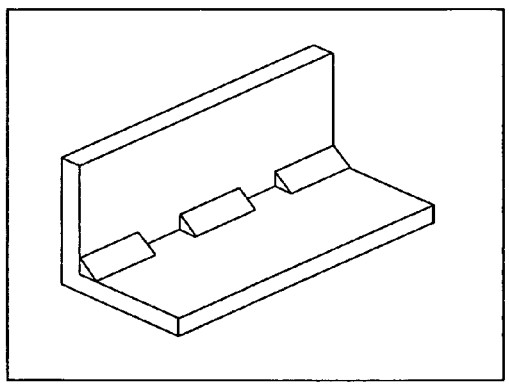
Figure 13D:
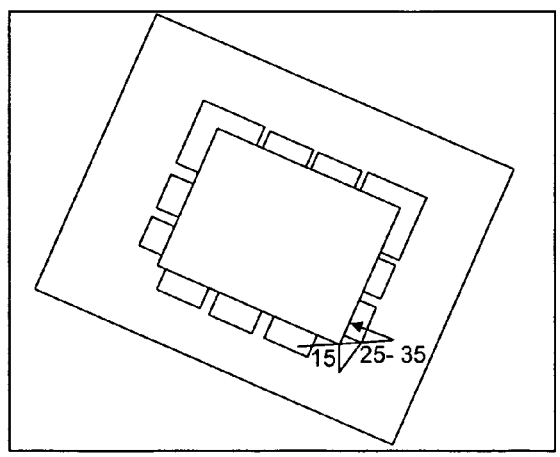

FIG. 13a illustrates an example triangular sweeping profile, in accordance with one embodiment. Using the example profile, sweeping along one of the sub-path of path P, results in an intermittent fillet weld instance of FIG. 13b. Repeating the process for all other sub-paths of path P results in the generation of the intermittent fillet weld bead of FIG. 13c, assuming 3 sub-paths for the example, and path P is an open path. However, in another example where path P is a multi-segment closed path with 11 sub-paths, repeating the process for all other sub-paths of path P results in the generation of the intermittent fillet weld bead of FIG. 13d.

Figure 13E:
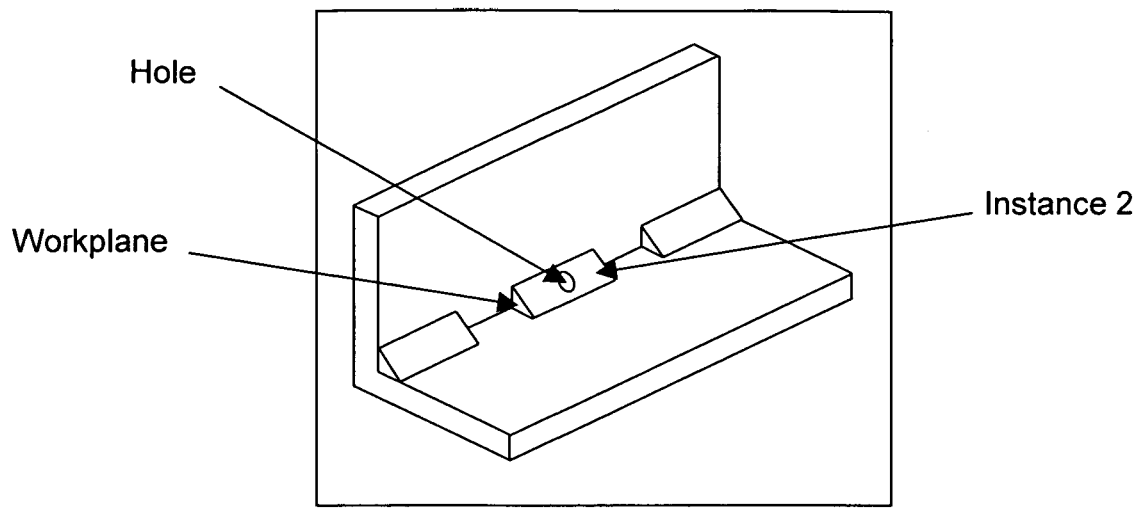

As illustrated by FIG. 13e, the resulting intermittent fillet weld bead may have dependent features. For the example of FIG. 13e, the intermittent fillet weld bead has a machining feature (e.g. a hole) passing through instance no. 2, and a workplane at one of the faces of instance no. 2.

As described earlier with references to FIG. 12a–12b, names of the topological entities of the sub-paths are persistently maintained across re-computations of the intermittent weld bead models, due to e.g. editing by a user. The editing may be of a direct type (i.e. editing the weld bead itself) or an indirect type (i.e. editing an upstream feature to which the weld bead depends).

Figure 14A:
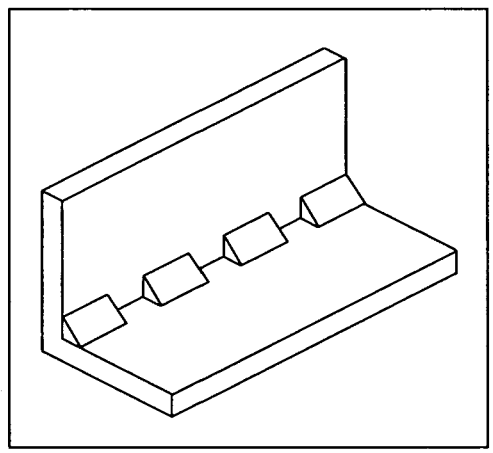
FIGS. 14a–14b illustrate two external views of two other examples of persistent naming, across re-computations of two intermittent fillet weld bead models, due to direct editing of the weld beads.
Figure 14B:
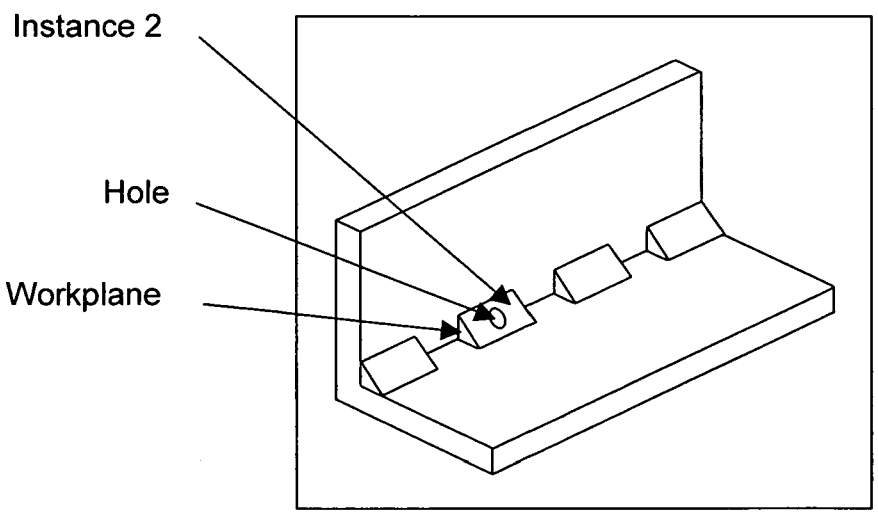

FIGS. 14a–14b illustrate two external views of two examples of persistent naming across re-computations, due to direct editing. More specifically, FIG. 14a illustrates an example of persistent naming across re-computations due to direct editing of the intermittent fillet weld bead of FIG. 13c. In this example, the length of the instance and the pitch of the weld bead have been changed. Resultantly, more number of fillet weld instances are produced. The unique and invariant names for the sub-paths are generated as earlier described, referencing FIG. 12a–12b.

FIG. 14b illustrates another example of persistent naming across re-computations due to direct editing of the intermittent fillet weld bead of FIG. 13e. In this example, the instance length and distance between the instances have been changed. Resultantly, more number of fillet weld instances are produced. However, the dependent features are still attached to instance no. 2 after the edit operation. The weld bead is guaranteed to be recomputed successfully with the same names on the topological entities of the sub-paths, as long as the input data is valid, i.e. a valid intersection can be computed from the intersection of FS1 and FS2 to generate a path P. The unique and invariant names for the sub-paths are generated as earlier described, referencing FIG. 12a–12b.

Thus, it can be seen from the above descriptions, embodiments of a novel method to name sub-paths, including their edges and vertices, of a continuous path of an intermittent fillet weld bead, having particular application to the generation of intermittent weld bead, have been described. While the novel method has been described in terms of the foregoing embodiments, those skilled in the art will recognize that the method is not limited to the embodiments described. The method may be practiced with modifications and alterations within the spirit and scope of the appended claims.

Accordingly, the description is to be regarded as illustrative instead of restrictive.

What is claimed is:

1. In a computing environment, a method comprising:
   receiving a continuous path (P) of an intermittent fillet weld bead to be used to weld a plurality of components of an article of manufacture together at one or more edges of one or more faces of the components in the manufacturing of the article outside the computing environment;
   determining an invariant weld bead generation direction for the continuous path (P);
   subdividing the continuous path (P) into substantially equal length sub-paths placed at substantially equal distance (d) from each other; and
   naming each sub-path, including its edge and vertices, employing the invariant weld bead generation direction.

2. The method of claim 1, said determining of the invariant weld bead generation direction comprises determining at least a global start vertex (GS).

3. The method of claim 2, wherein the determining of at least the global start vertex (GS) comprises determining whether the continuous path (P) is an open path or a closed path.

4. The method of claim 3, wherein for the open path, the determining further comprises determining which one of two ends of the continuous open path is closest to an initial pick point of a face of a component, and selecting the end as the global start vertex (GS).

5. The method of claim 4, wherein for the open path, the determining further comprises selecting the other end as a global end vertex (GE).

6. The method of claim 3, wherein for the closed path, the determining further comprises determining whether the closed path is a closed single segment path, or a closed multiple segment path.

7. The method of claim 6, wherein for the closed single segment path, the determining further comprises selecting its single vertex as the global start vertex (GS).

8. The method of claim 7, wherein for the closed single segment path, the determining further comprises selecting the single vertex as the global end vertex (GE).

9. The method of claim 6, wherein for the closed multiple segment path, the determining further comprises selecting a first vertex of the multiple segment path with a lowest integer index as the global start vertex (GS).

10. The method of claim 9, wherein for the closed multiple segment path, the determining further comprises selecting a second vertex of the multiple segment path with a next lowest integer index as a global end vertex (GE).

11. The method of claim 10, wherein said naming comprises generating a name for a selected one of an edge of a sub-path and a vertex of a sub-path.

12. The method of claim 11, wherein said generating comprises forming an input set for a name generation table, the input set including a name of a progenitor edge, a split index and a vertex flag, and providing the input set for the name generation table to return an unique and persistent name.

13. The method of claim 12, wherein when naming a sub-path, said forming comprises setting the vertex flag to a value of −1 for an edge.

14. The method of claim 12, wherein when naming a vertex, said forming comprises setting the vertex flag to a value of 0 for a starting vertex, and to a value of 1 for an ending vertex.

15. The method of claim 12, wherein the name generation table generates and returns a new name if the input set is new, as well as saves the generated and returned new name, input set combination, and the name generation table further returns the previously generated and returned name if the input set has been previously provided to the name generation table function.

16. A machine readable article comprising
   a machine readable storage medium; and
   a plurality of machine executable instructions stored in the machine readable storage medium, with the instructions designed to enable a apparatus to
      receive a continuous path (P) of an intermittent fillet weld bead to be used to weld a plurality of components of an article of manufacture together at one or more edges of one or more faces of the components in the manufacturing of the article outside the apparatus;
      determine within the apparatus an invariant weld bead generation direction;
      subdivide within the apparatus the continuous path (P) into substantially equal length sub-paths placed at substantially equal distance (d) from each other; and
      name within the apparatus each sub-path, including its edge and vertices, employing the determined invariant weld bead generation direction.

17. The article of claim 16, wherein the instructions are designed to enable the apparatus to determine, as part of said determining of the invariant weld bead generation direction, at least a global start vertex (GS).

18. The article of claim 17, wherein the instructions are designed to enable the apparatus to determine, as part of said determining of at least the global start vertex (GS), whether the continuous path (P) is an open path or a closed path.

19. The article of claim 18, wherein the instructions further enable the apparatus to
determine, for the open path, which one of two ends of the continuous open path is closest to an initial pick point of a face of a component, and select the end as the global start vertex (GS), and the other end as a global end vertex (GE); and
determine, for a closed path, whether the closed path is a closed single segment path or a closed multiple segment path,
select, for the closed single segment path, its single vertex as the global start vertex (GS) as well as the global end vertex (GE), and
select, for the closed multiple segment path, a first vertex with a lowest index as the global start vertex (GS), and a second vertex with a next lowest index as the global end vertex (GE).

20. The article of claim 16, wherein said naming comprises generating a name for a selected one of a sub-path and a vertex of a sub-path, including forming an input set for a name generation table, the input set including a name of a progenitor edge, a split index and a vertex flag, and providing the input set for the name generation table to return an unique and persistent name.

21. An apparatus comprising:
storage medium having stored therein a plurality of instructions designed to enable the apparatus to
receive a continuous path (P) of an intermittent fillet weld bead to be used to weld a plurality of components of an article of manufacture together at one or more edges of one or more faces of the components in the manufacturing of the article outside the apparatus;
determine within the apparatus an invariant weld bead generation direction;
subdivide within the apparatus the continuous path (P) into substantially equal length sub-paths placed at substantially equal distance (d) from each other; and
name within the apparatus each sub-path, including its edge and vertices, employing the determined invariant weld bead generation direction; and
at least one processor coupled to the storage medium to execute the instructions.

22. The apparatus of claim 21, wherein the instructions are designed to determine, as part of said determining of an invariant weld bead generation direction, at least the global start vertex (GS).

23. The apparatus of claim 22, wherein the instructions are designed to determine, as part of said determining of at least the global start vertex (GS), whether the continuous path (P) is an open path or a closed path.

24. The apparatus of claim 23, wherein the instructions further enable the apparatus to
determine, for the open path, which one of two ends of the continuous open path is closest to an initial pick point of a face of a component; and
determine, for the closed path, whether the closed path is a closed single segment path or a closed multiple segment path.

25. The apparatus of claim 24, wherein the instructions further enable the apparatus to
select, for the open path, which the end determined to be closest to the initial pick point of the face of a component as the global start vertex (GS), and the other end as a global end vertex (GE);
select, for the closed single segment path, its single vertex as the global start vertex (GS) as well as the global end vertex (GE), and
select, for the closed multiple segment path, a first vertex with a lowest index as the global start vertex (GS), and a second vertex with a next lowest index as the global end vertex (GE).

26. The apparatus of claim 21, wherein the instructions are designed to enable the apparatus to generate, as part of said naming, a name for a selected one of a sub-path and a vertex of a sub-path.

27. The apparatus of claim 26, wherein said generating comprises forming an input set for a name generation table, the input set including a name of a progenitor edge, a split index and a vertex flag, and providing the input set for the name generation table to return an unique and persistent name.

28. The apparatus of claim 27, wherein the instructions are further designed to enable the apparatus to
setting the vertex flag to a value of −1, when naming an edge of a sub-path; and
setting the vertex flag to a value of 0 for a starting vertex, and to a value of 1 for an ending vertex, when naming a vertex.

29. The apparatus of claim 27, wherein the name generation table function generates and returns a new name if the input set is new, and the name generation table function further saves the generated and returned new name, input set combination.

30. The apparatus of claim 27, wherein name generation table function returns the previously generated and returned name if the input set has been previously provided to the name generation table function.

* * * * *

UNITED STATES PATENT AND TRADEMARK OFFICE
CERTIFICATE OF CORRECTION

PATENT NO. : 7,206,661 B2 Page 1 of 1
APPLICATION NO. : 10/676275
DATED : April 17, 2007
INVENTOR(S) : Somashekar Ramachandran Subrahmanyam and Shivakumar Sundaram It is certified that error appears in the above-identified patent and that said Letters Patent is hereby corrected as shown below:

In the Drawings, Sheet 5 of 13, Figure 5:
    reference numeral "412" should read --408--;
    reference numeral "414" should read --410--.

Signed and Sealed this

Eighteenth Day of September, 2007

JON W. DUDAS
*Director of the United States Patent and Trademark Office*